(12) United States Patent
Guidon et al.

(10) Patent No.: US 7,350,753 B2
(45) Date of Patent: Apr. 1, 2008

(54) RF SHIELDING FOR AIRCRAFT WINDOWS

(75) Inventors: John Guidon, Thousand Oaks, CA (US); Gregg Fialcowitz, Northridge, CA (US)

(73) Assignee: Row 44, Inc., Westlake Village, CA (US)

( * ) Notice: Subject to any disclaimer, the term of this patent is extended or adjusted under 35 U.S.C. 154(b) by 11 days.

(21) Appl. No.: 11/187,062

(22) Filed: Jul. 21, 2005

(65) Prior Publication Data

US 2007/0045470 A1 Mar. 1, 2007

(51) Int. Cl.
*B64C 1/14* (2006.01)

(52) U.S. Cl. .................... 244/129.3; 244/129.1

(58) Field of Classification Search .......... 244/129.1, 244/129.3
See application file for complete search history.

(56) References Cited

U.S. PATENT DOCUMENTS

| | | | |
|---|---|---|---|
| 3,431,348 A * | 3/1969 | Lamp et al. | 174/389 |
| 3,453,620 A * | 7/1969 | Reed et al. | 342/4 |
| 4,613,530 A | 9/1986 | Hood et al. | |
| 4,721,636 A | 1/1988 | Hood et al. | |
| 5,169,713 A * | 12/1992 | Kumurdjian | 428/323 |
| 5,488,371 A * | 1/1996 | Targove | 342/1 |
| 5,510,575 A | 4/1996 | Weibler | |
| 6,188,015 B1 * | 2/2001 | Curran et al. | 174/353 |
| 6,195,034 B1 * | 2/2001 | Tsuno et al. | 342/1 |
| 6,204,480 B1 * | 3/2001 | Woodard et al. | 219/203 |
| 6,403,147 B1 | 6/2002 | McCurdy et al. | |
| 6,504,501 B2 * | 1/2003 | Tsuno et al. | 342/1 |
| 6,561,460 B2 * | 5/2003 | Rukavina et al. | 244/129.3 |
| 6,680,489 B1 * | 1/2004 | Brandes et al. | 257/77 |
| 6,813,493 B2 * | 11/2004 | Criqui et al. | 455/431 |
| 2002/0160773 A1 * | 10/2002 | Gresham et al. | 455/431 |
| 2003/0087048 A1 * | 5/2003 | Chaussade et al. | 428/34 |
| 2004/0229607 A1 * | 11/2004 | La Chapelle et al. | 455/431 |

* cited by examiner

*Primary Examiner*—Timothy D. Collins
(74) *Attorney, Agent, or Firm*—Thomas F. Lebens; Sinsheimer Juhnke Lebens & McIvor, LLP

(57) ABSTRACT

Disclosed is an improved aircraft window having RF shielding. In one embodiment, a window shield comprises an electrically conductive, transparent, flexible film, which is applied by known processes to a window pane. This shield is grounded to the aircraft frame or exterior by a "tail" of conductive material, which is secured to a ground point in the vicinity of the window pane.

7 Claims, 4 Drawing Sheets

RF SHIELDING FOR AIRCRAFT WINDOWS

1. FIELD OF INVENTION

This relates to improvements in window units installed in aircraft of all types. Specifically, this relates to aircraft windows capable of shielding against the transmission of radio frequency (RF) energy.

2. BACKGROUND

The increasing usage of cellular telephones and other wireless electronic devices generally has given rise to a demand for the use such devices by passengers while traveling in aircraft. In most commercial aircraft, however, the passengers are prohibited from using these wireless devices, since their use interferes with services outside the aircraft. When activated on board aircraft, cellular telephones will actively try, and sometimes succeed, in communicating via ground based cellular infrastructure. This is undesirable, and not allowed by government regulations.

As shown in FIG. 1, an aircraft 10 has an aluminum exterior 12, a passenger compartment 14 and a plurality of windows 16. It is believed that the primary means of transmission of RF energy between the passenger compartment 14 and the exterior of the aircraft 10 is via the windows 16. This includes the transmission of electromagnetic transmission frequencies currently in use for cellular phones which commonly operate in the 800 Mhz to 5 Ghz frequency range.

There is a need, therefore, for improved aircraft windows that are transparent to electromagnetic energy in the visible spectrum, yet opaque to RF energy.

SUMMARY OF THE ILLUSTRATED EMBODIMENTS

Disclosed is an improved aircraft window, where RF shielding is desirable. In one embodiment, a window shield comprises an electrically conductive, transparent, flexible film, which is applied by known processes to a window pane. This shield is grounded to the aircraft frame or exterior by a "tail" of conductive material, which is secured to a ground point in the vicinity of the window pane.

In an alternative embodiment, a window pane may support elements of conductive material embedded in the pane which are formed into patterns such as grids, that are adapted to absorb energy at the wavelengths emitted by cell phones, or to absorb other radiation.

Embodiments of the present invention therefore allow visible light to pass through an aircraft window while shielding certain other electromagnetic energy. The improved window will facilitate use of certain electronic devices within the aircraft, without interference being caused by or to other signals, outside the plane.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

These and/or other aspects and advantages of the present invention will become apparent and more readily appreciated from the following description of the preferred embodiments, taken in conjunction with the accompanying drawings of which.

DETAILED DESCRIPTION

Figure 1:
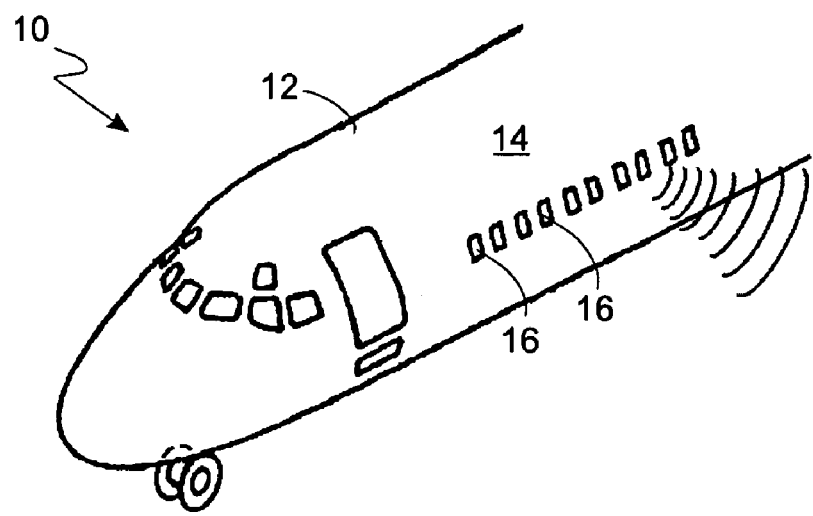
FIG. 1 is an exterior view of a portion of an aircraft having a plurality of windows.

Reference will now be made in detail to embodiments of the present invention, examples of which are illustrated in the accompanying drawings, wherein like reference numerals refer to like elements throughout. It is understood that other embodiments may be utilized and structural and operational changes may be made without departing from the scope of the present invention.

Figure 2:
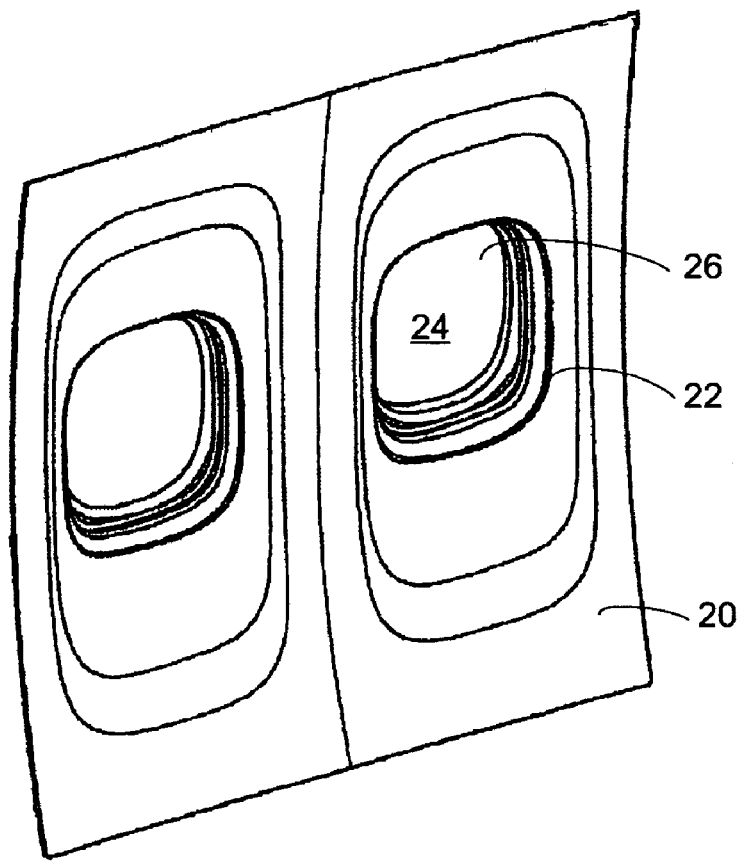
FIG. 2 is an interior view of a portion of an aircraft with two window assemblies in accordance with an embodiment of the invention.
Figure 3:
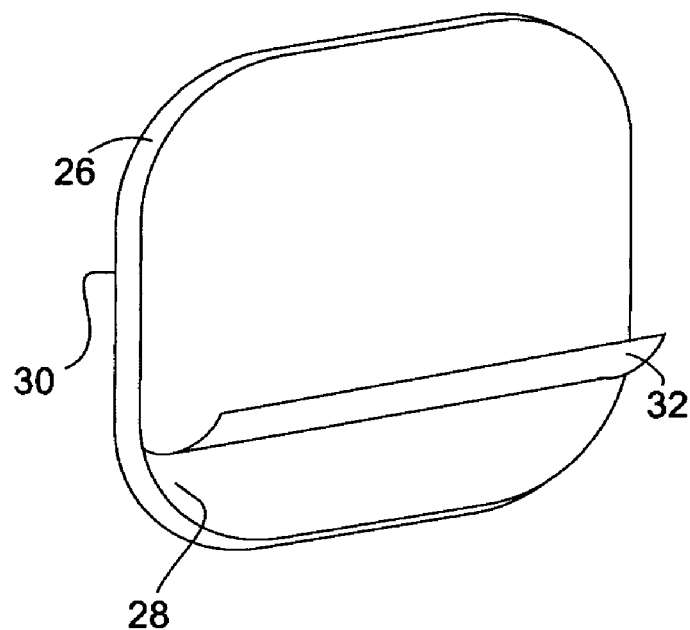
FIG. 3 is an aircraft window pane of one of the window assemblies of FIG. 2.

FIG. 2 is a simplified diagram of a portion of the interior of an aircraft that includes windows in accordance with an embodiment of the invention. Referring to FIGS. 2 and 3, the aircraft interior includes an interior bulkhead 20, a window frame 22, and a window 24. The window 24 has a transparent pane 26 having an inner surface 28 and an outer surface 30. A transparent conductive film 32 overlays the inner surface 28 of the pane 26. The film 32 is constructed of a material that is transparent to visible light but adapted to attenuate RF energy. An exemplary material that would satisfy this purpose is Scotchtint™ which can: be obtained from 3M Company located in St. Paul, Minn.

In order to better attenuate the RF energy, the film 32 is electrically grounded. This electrical grounding is accomplished by a pigtail of the same material (not shown), extending outwardly from a point on the perimeter of the film 32, and attached by conductive adhesive to any convenient nearby point that is electrically connected to the skin of the aircraft, but usually the inside of the skin of the aircraft itself. In alternative embodiments, however, electrical grounding can be accomplished by other means known in the art. For purposes of this application, and in view of the use of embodiments of the invention in the context of an aircraft that is airborne, reference herein to ground and to electrical grounding includes making an electrical connection to the conductive skin of an aircraft while it is airborne.

The film 32 can be applied to the inner surface 28 by any of at least two methods. One involves moistening the film on the side to be applied to the window, then positioning the film and applying pressure with a roller to ensure close contact between the film and the glass. Another method is to use a film that is already coated on one side with a layer of clear adhesive and press that side against the window.

Because the film 32 is applied to the inner surface 28 of the pane 26, it would be desirable to cover the film 32 with a protective coating or another transparent pane in order to guard against scratches and other damage to the film 32. In alternative embodiments, however, the film 32 may be applied to the outer surface 30 of the pane 26, in which case a protective layer may not be required for those aircraft window designs that employ one or more additional panes between the outer surface 30 and the exterior of the aircraft.

Figure 4:
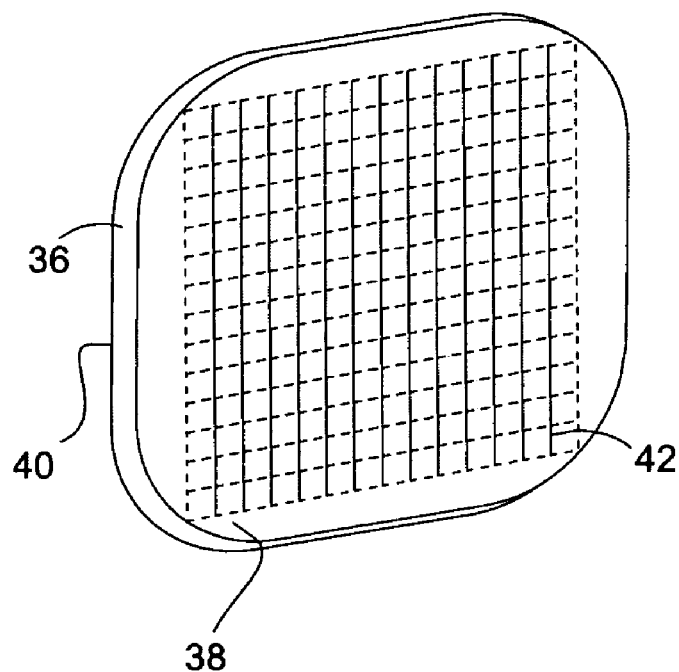
FIG. 4 is an aircraft window pane in accordance with another embodiment of the invention.

FIG. 4 is an aircraft window in accordance with another embodiment of the invention. The window includes a transparent pane 36 having an inner and outer surface 38, 40. Disposed or embedded within the pane 36 between its inner and outer surfaces 38, 40 is a film that includes an electrically conductive material 42 that is arranged in a pattern adapted to attenuate RF energy. Electrically conductive material, such as copper, is used in the film, although other embodiments may employ other metals, alloys, compositions, etc. that are electrically conductive.

As shown in FIG. 4, the pattern used is a grid comprised of generally square openings of dimensions, such as for example three square, centimeters, that have been found to be effective for attenuating RF energy. In other embodiments, however, other patterns may be used, such as a pattern comprised of generally triangular openings or other fractal-derived shapes. In order to better attenuate the RF energy, the conductive material 42 is electrically grounded by use of a pigtail of the same material (not shown), extending outwardly from a point on the perimeter of the conductive material 42, and attached by conductive adhesive to any convenient nearby point that is electrically connected to the skin of the aircraft. In alternative embodiments, however, electrical grounding can be accomplished by other means known in the art.

Figure 5:
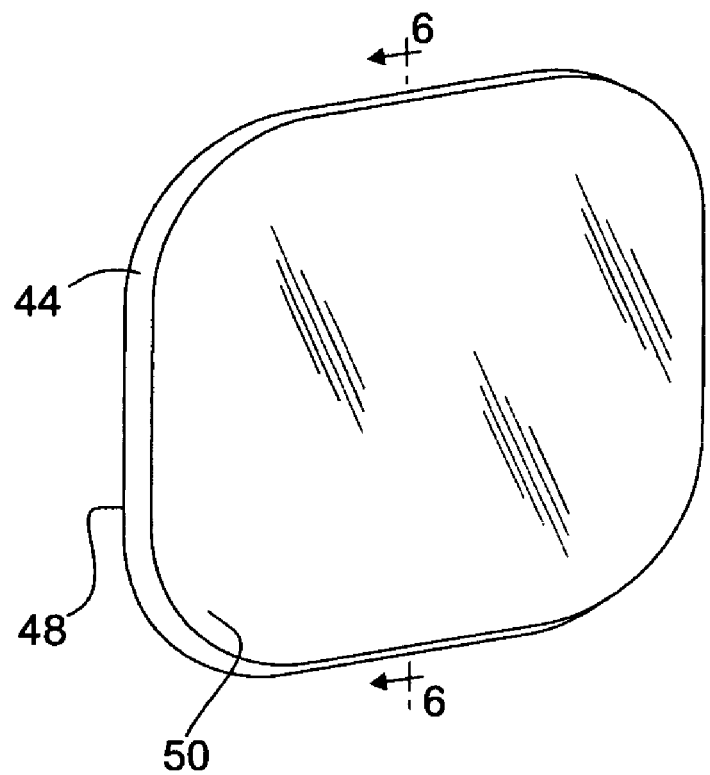
FIG. 5 is an aircraft window pane in accordance with yet another embodiment of the invention.
Figure 6:
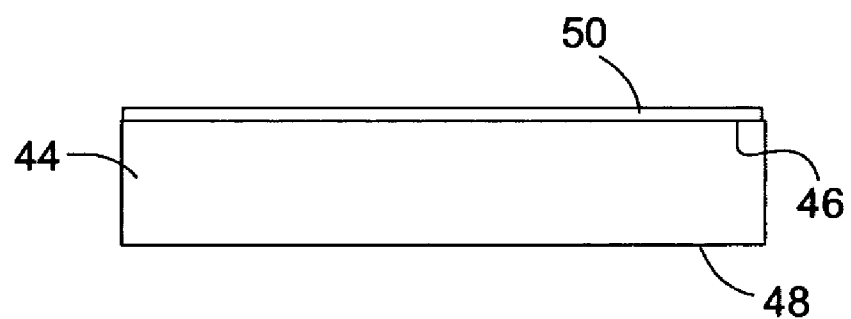
FIG. 6 is an enlarged sectional view of the window pane of FIG. 5 taken along the line 6-6 of FIG. 5.

FIGS. 5 and 6 show an aircraft window in accordance with yet another embodiment of the invention. As before, the window includes a transparent pane 44 having an inner and outer surface 46, 48. In this instance, however, a layer 50 of transparent conductive material is applied to the inner surface 46. Originally in liquid form, the conductive material is sprayed or brushed on the inner surface 46, and then allowed to dry to a solid form which constitutes the layer 50. The material that forms the layer 50 is transparent to visible light but adapted to attenuate RF energy. An exemplary material that would accomplish this is Lectrobase™ which can be obtained from LVH Coatings Ltd., located in Coleshill, UK. Basically this type of layer is constructed of polyurethane resins containing dispersed electroconductive agents.

In order to better attenuate the RF energy, the layer 50 is electrically grounded which is accomplished by use of a strip of electrically conductive film (not shown) secured to the window perimeter and the inside of the aircraft skin by conductive adhesive. Alternatively, electrical grounding can be accomplished by overspraying of the window surround with the layer 50 material so as to establish electrical continuity. In yet further alternative embodiments, electrical grounding can be accomplished by other means known in the art.

Because the layer 50 is applied to the inner surface 46 of the pane 44, it would be desirable to cover the layer 50 with a protective coating or another transparent pane in order to guard against scratches and other damage to the layer 50. In alternative embodiments, however, the layer 50 may be applied to the outer surface 48 of the pane 44, in which case a protective layer may not be required for those aircraft window designs that employ one or more additional panes between the outer surface 48 and the exterior of the aircraft.

Figure 7:
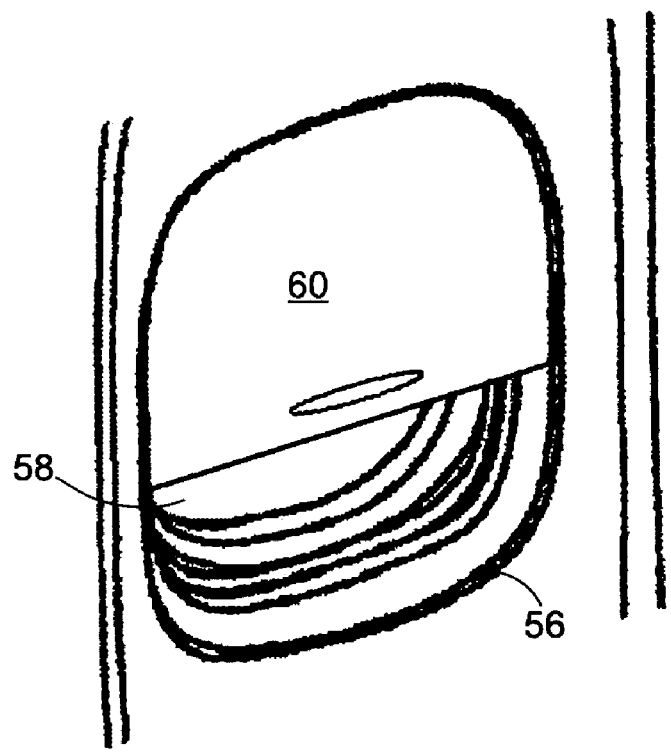
FIG. 7 is an aircraft window assembly in accordance with another embodiment of the invention.
Figure 8:
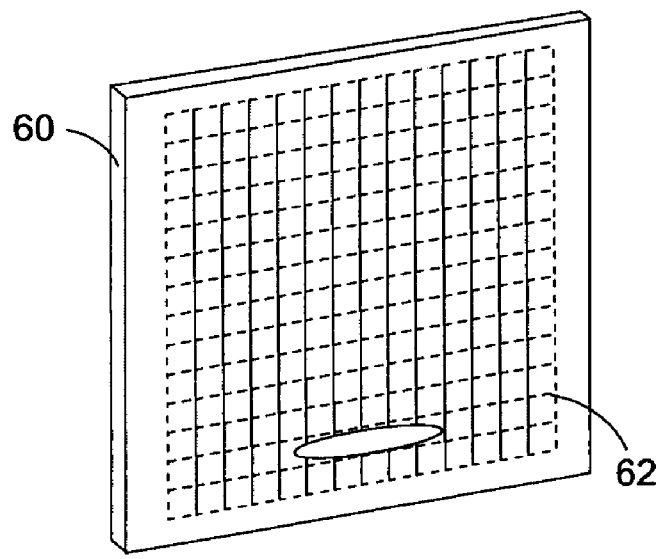
FIG. 8 is the window shade of FIG. 7.

In FIGS. 7 and 8, there is shown an aircraft window frame 56, a transparent pane 58, and a movable shade 60. The pane 58 is disposed in the frame 60 and has an inner and outer surface. The shade 60 is movable with respect to the frame 56 and is adapted to cover the pane 58. (In FIG. 7, however, the shade 60 is shown in an intermediate position.) Embedded within the shade 60 is a conductive metal mesh 62 adapted to attenuate RF energy. The mesh 62 is constructed of fine copper wire. In other embodiments, however, other conductive material could be used in lieu of the copper wire mesh 62. The mesh 62 in the shade 60 is electrically connected to ground by a pigtail of any suitably conductive braid or wire (not shown), connected to any point that is electrically connected to the aircraft skin. In alternative embodiments, however, electrical grounding can be accomplished by other means known in the art.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. An aircraft window comprising:
   a transparent pane having an inner surface and an outer surface; and
   a patterned electrically conductive material disposed between the inner and outer surfaces, wherein the patterned electrically conductive material is disposed in a predetermined grid-shaped pattern adapted to attenuate RF energy and is disposed to be in direct contact with either the inner or outer surface, wherein the patterned electrically conductive material forms a plurality of polygon-shaped openings, the openings remaining uncovered.

2. The aircraft window of claim 1, wherein the electrically conductive material is electrically connected to ground.

3. The aircraft window of claim 1, wherein the pattern is a grid comprised of generally square openings.

4. The aircraft window of claim 1, wherein the pattern is a grid comprised of generally triangular openings.

5. The aircraft window of claim 1, wherein the pattern is a fractal-derived shape.

6. An aircraft window comprising:
   a transparent pane having an inner surface and an outer surface; and
   a layer of a changeable form transparent conductive material disposed on one of the inner and outer surfaces and being disposed in a predetermined grid-shaped pattern that is adapted to attenuate RF energy, the layer being in direct contact with either the inner or outer surface, the layer forming a plurality of polygon-shaped openings, the openings remaining uncovered;
   wherein the changeable form transparent conductive material is in liquid form prior to placement on the one of the inner and the outer surfaces, and
   wherein the changeable form transparent conductive material is in a solid form after placement on the one of the inner and outer surfaces.

7. The aircraft window of claim 6 wherein the transparent conductive material is electrically connected to ground.

* * * * *